United States Patent [19]
Farassat

[11] Patent Number: 5,950,903
[45] Date of Patent: Sep. 14, 1999

[54] BONDING HEAD

[75] Inventor: Farhad Farassat, Taufkirchen, Germany

[73] Assignee: F & K Delvotec Bondtechnik GmbH, Ottobrunn, Germany

[21] Appl. No.: 08/826,351

[22] Filed: Mar. 25, 1997

[51] Int. Cl.$^6$ .................................................. H01L 21/60
[52] U.S. Cl. .............................................. 228/1.1; 228/4.5
[58] Field of Search ....................................... 228/1.1, 4.5

[56] References Cited

U.S. PATENT DOCUMENTS

| | | | |
|---|---|---|---|
| 5,060,841 | 10/1991 | Oshima et al. | 228/4.5 |
| 5,277,355 | 1/1994 | Weaver et al. | 228/4.5 |
| 5,452,838 | 9/1995 | Farassat | 228/1.1 |

FOREIGN PATENT DOCUMENTS

| | | | |
|---|---|---|---|
| 59-130433 | 7/1984 | Japan | 228/4.5 |

*Primary Examiner*—Geoffrey S. Evans
*Assistant Examiner*—Jeffrey T. Knapp
*Attorney, Agent, or Firm*—Westman, Champlin & Kelly, P.A.

[57] ABSTRACT

A bonding head is provided for a wire bonding machine which includes a wedge (2) connected to a transducer (3) for applying pressure and ultrasonic energy to a wire (1) guided into contact with a substrate to which a bond is to be formed. A support system (7, 8, 9) is provided for simultaneously securing the transducer (3) to the bonding head frame (12) and variably adjusting the contacting pressure of the wire to the substrate. Springs (9a, 9b), preferably leaf springs, urge the transducer (3), while a linear actuator (8) is arranged to variably tension the springs (9a, 9b) to adjust the bond force.

9 Claims, 3 Drawing Sheets

BONDING HEAD

The present invention relates to a bonding head for a wire bonding machine of the type used in the electronics industry to fabricate a variety of electronic devices.

Such wire bonding machines generally supply an aluminum or gold wire to a wedge, which guides the wire to a point on a substrate of an electronic component, where a bond is required. The wedge is connected to a transducer, which transmits ultrasonic energy through the wedge to the wire to cause bonding. Conventionally, the transducer is pivotally mounted on a frame of the bonding head and biased toward the substrate by urging rotation of the transducer. The biasing produces a predetermined force applied to the wire by the wedge when in contact with the substrate.

In such conventional devices, it is difficult to maintain the desired bonding force and recalibration after a given time is necessary. This requires interruption of the bonding operation and the necessity of service manpower in monitoring the bonding machine.

In addition, the pivotal mounting of the transducer leads to some inaccuracy in applying the bond at a precise point. The arc subscribed by the wedge at the end of the pivotal transducer causes a slight inaccuracy in positioning of the bond on the two-dimensional surface of the substrate. In modern bonding technology, even deviations in positioning of tenths of a micron are important.

An object of the present invention is to provide an improved bonding head in which the bonding force can be better adjusted and maintained and in which the positional alignment accuracy of the wedge with respect to the substrate can be increased. In addition, the bonding head should be mechanically simple and reliable to reduce maintenance and service costs.

According to the present invention, within a bonding head, a guide, such as a wedge, guides a wire into contact with a substrate on which a bond is to be formed. A transducer applies pressure and ultrasonic energy to the guide. Support means are provided which have multiple functions. The support means secure the transducer to the bonding head frame and at the same time are variably adjustable to adjust the bonding force.

Preferably the support means comprise spring means which are fixed at one end to the head frame and at another end to a transducer holder which has the transducer fixed thereto. In this embodiment a linear actuator is arranged to variably tension the springs, such that the guide or wedge is urged with the wire toward the substrate by a variable force which may be predetermined.

In a further embodiment, the spring means are provided as leaf springs arranged parallel to one another substantially forming a parallelogram. Upon deflection of the springs, only the angle of the parallelogram changes, the parallel relationship of the springs being maintained. As a result, the transducer as well as the attached wedge move substantially vertically, with only a minimum angular or lateral displacement.

Further objects and advantages of the invention will become apparent in the following description of embodiments in conjunction with the drawings, in which.

As is well known in the bonding art, a wide variety of bonding operations and associated machines exist. The components of the machine may vary depending on the type of wire to be bonded (gold or aluminum) as well as its thickness. In addition, the configuration of the bonding head may depend on the bonding procedure, for example ball bonding, wedge bonding, etc. The embodiments shown here relate to a wedge bonding machine, while the invention is not limited to this configuration.

Figure 1:
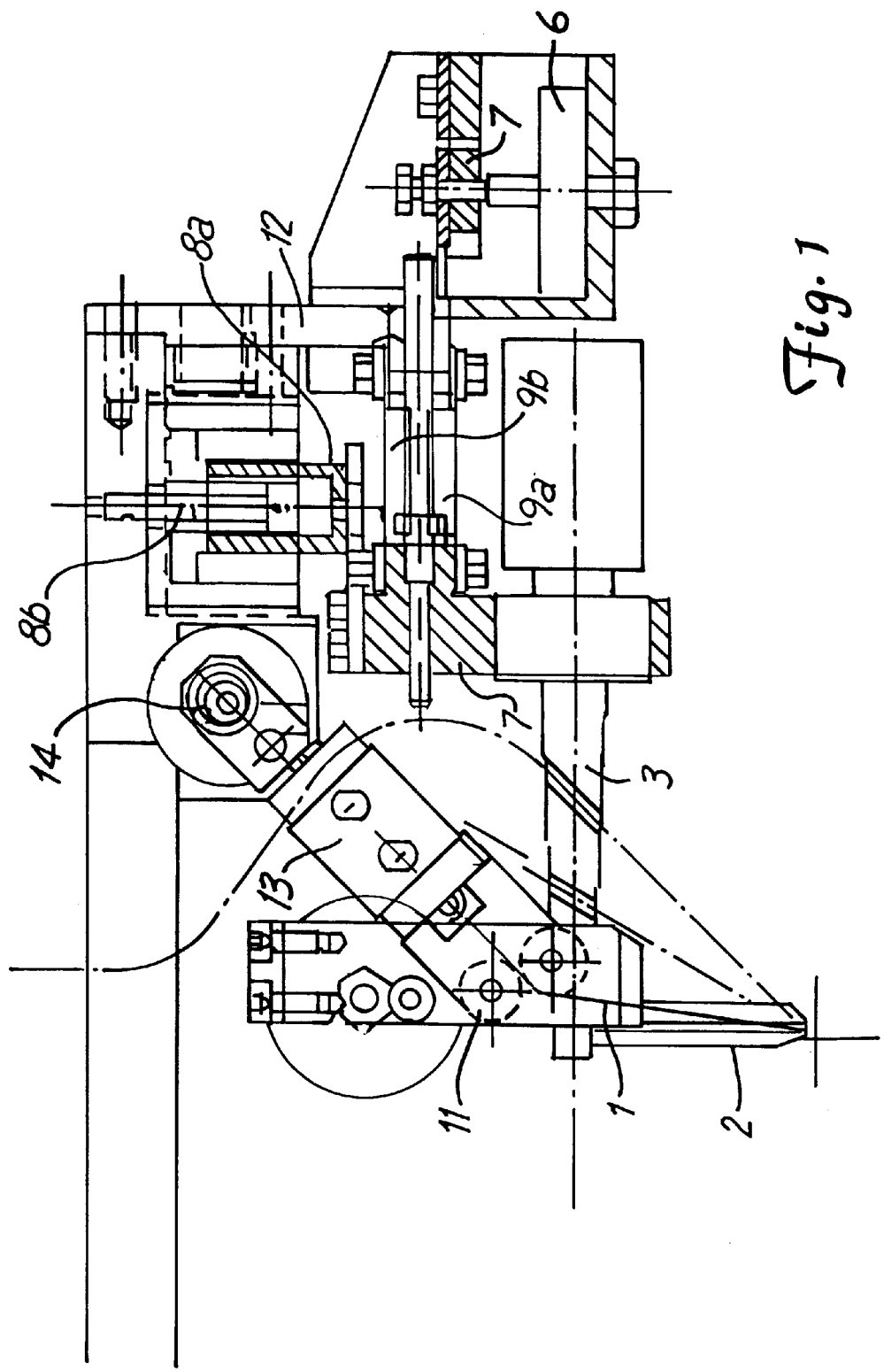
FIG. 1 shows an elevation view of a bonding head according to one embodiment of the invention.

FIG. 1 shows a bonding head for thin or thick wire according to a first embodiment, where the numeral 12 indicates a frame to which the components are attached. As will be understood, the entire bonding head moves vertically within the bonding machine (not shown) to approach and retract from the substrate. The wedge 2 is provided for guiding a wire 1 to a point on the substrate where a bond is to be formed. The wire 1 is supplied by the wire supply means 13, which include a wire clamp 11. Operation of the wire supply means 13 will be discussed in more detail below.

The wedge 2 is fixed to a transducer 3 which provides the necessary ultrasonic energy for bonding. The transducer 3 is fixed to a transducer holder 7, which is secured to the frame 12 by support means 8, 9. The support means include spring means 9a, 9b as well as a linear actuator 8 mounted to variably tension the spring means 9a, 9b.

The spring means preferably comprise at least two leaf springs 9a, 9b. As seen in the schematic diagram of FIG. 2, one end A, B of each leaf spring is fixed to the frame 12. As seen in the embodiment of FIG. 1, the springs 9a, 9b are fixed at their right hand end by bolts to the frame 12. In addition, the other end of the leaf springs are fixed to the transducer holder 7. The securement of the leaf springs 9a, 9b to the head frame 12 and the holder 7 are shown even more clearly in FIG. 3.

Figure 2:
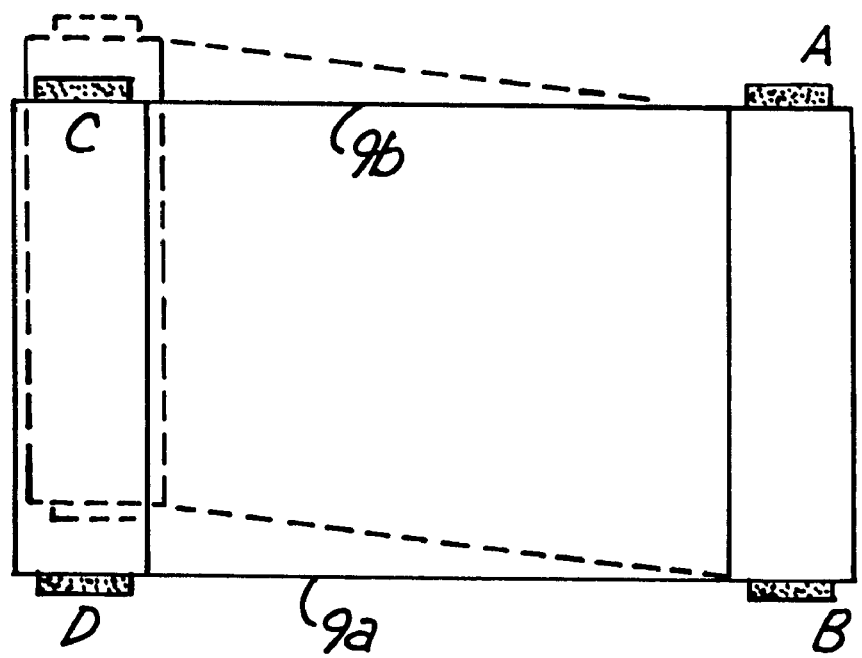
FIG. 2 shows a schematic illustration of the deflection of the leaf springs.

The spring mounting of the transducer holder 7 may be accomplished in various configurations. Preferably two or four leaf springs are arranged substantially parallel to one another to form a parallelogram as shown in FIG. 2. In the embodiment of FIG. 1, four leaf springs are provided whereby only two springs 9a, 9b are visible in the side view. Two more leaf springs are present behind these two, all four of the springs being parallel and forming a parallelepided.

Figure 3:
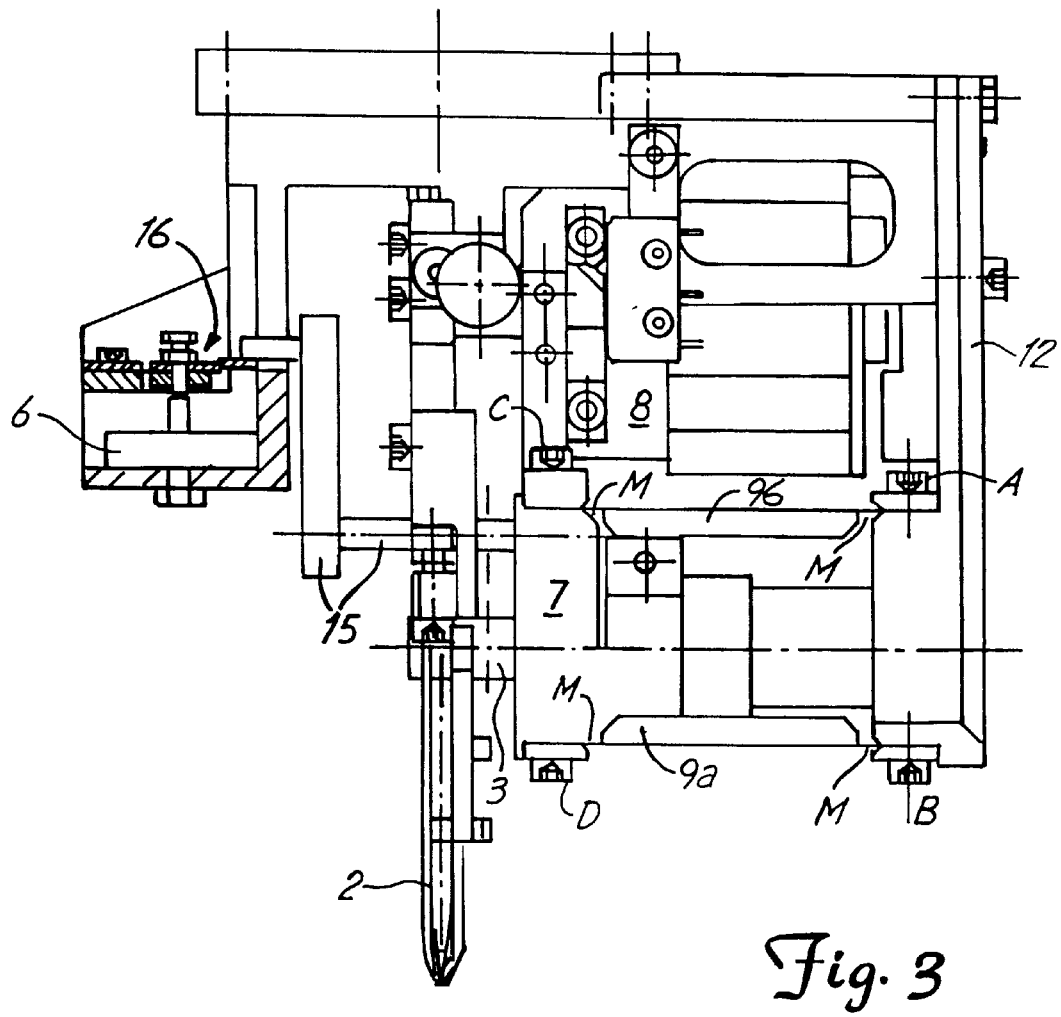
FIG. 3 shows an elevation view of a bonding head according another embodiment of the invention.

As can be seen in the illustration of FIG. 2, when the linear actuator 8 deflects the transducer holder 7 vertically upwardly, the springs 9a, 9b are deflected, whereby the parallel relationship between the springs is maintained. This effect is present whether two or four leaf springs are employed. In the embodiments of FIG. 1 and 3, the leaf springs are provided with a stiffening member, which in the figure is a rib disposed plane to the paper and perpendicular to the direction of deflection of the leaf springs. With this arrangement the springs do not flex in their central section but are only free to flex at portions on either side of the central section adjacent to where the first and second ends are fixed. These portions where bending occurs are marked with the letter M in the embodiment of FIG. 3.

Returning to FIG. 1, the linear actuator 8 comprises a fixed element 8b secured to the frame 12 and a cooperating element 8a secured to the transducer holder 7. The actuator 8 is preferably of the linear motor type by which the cooperating element 8a is moved linearly with respect to the fixed element 8b by means of application of a magnetic field. By activating the linear actuator 8, the cooperating element 8a undergoes linear displacement thereby causing deflection of the spring means 9a, 9b in the direction toward or away from the substrate, namely substantially in vertical direction.

In operation, the force to be applied to the wire for bonding can be adjusted by adjusting the displacement of the leaf springs 9a, 9b by means of the linear actuator 8. Prior to contact of the wire with the substrate, the springs 9a, 9b are deflected against the return force of the springs as shown in FIG. 2. The rest position of the springs is illustrated by the solid line, whereas the deflected position is indicated by dashed lines. With the leaf springs 9a, 9b being deflected as shown in FIG. 2, a return force arises towards the rest position, the magnitude of the force depending on the magnitude of deflection. Upon contact of the wire with the substrate, this force is transmitted through the transducer holder, the transducer and finally to the wire providing the bonding force. In this manner, the magnitude of the bonding force can be preset to a desired value and adjusted by the amount of movement of the linear actuator when tensioning the springs.

In the embodiment of FIG. 1, detecting means 6 are also provided, preferably in the form of a piezo detector. The transducer holder 7 is shown in cross-section in FIG. 1 and has an extension piece shown at the right of the figure above the piezo element 6. When the holder 7 is biased by the springs 9a, 9b, the extension piece engages the piezo element 6, whereby the biasing force of the springs can be measured. The output of the piezo detector 6 is connected to control means (not shown) for automatically adjusting the biasing force, which is directly related to the bonding force applied by the wedge. For this purpose, the control means include an electric control loop connected to the drive mechanism of the linear actuator 8. The control means measure the present bonding force and compare this with a prestored desired force. If the deviation is larger than an acceptable amount, the linear actuator is activated to provide the proper displacement of the springs whereby the desired bonding force is achieved.

The bonding head of FIG. 3 is suitable for thick wire and gold wire. In this embodiment, the piezo element 6 is located on the other side of the wedge 2. The transducer holder 7 is provided with a linkage 15, which contacts a mechanical coupler 16. The coupler 16 engages the piezo element 6. With this arrangement, the downward force exerted by the springs 9a, 9b on the transducer holder 7 can be measured and processed in the control means.

In the embodiment of FIG. 1, the bonding head is provided with a wire supply means 13 which is mounted on a linearly movable guide with an excenter drive 14. The motion of said drive 14 is controlled by a stepping motor. The supply means 13 advances the wire 1 to the wedge 2. As shown in FIG. 1, during the bonding process, the wire 1 is clamped by the clamping means 11. The supply means 13 can be pivoted about the axis 14, whereby the clamping means 11 are also pivoted. In this manner, the wire 1 can be supplied to the wedge 2 at various different angles with respect to the vertical direction of the wedge, as indicated by the dash-dot lines in FIG. 1. Preferably the supply means are adjustable such that delivery angles of 30°, 45° and 60° are possible.

I claim:

1. A bonding head for a wire bonding machine, comprising a guide (2) connected to a transducer (3) for applying pressure and ultrasonic energy to a wire guided into contact with a substrate on which a bond is to be formed and support means (7, 8, 9) for simultaneously securing the transducer (3) to the bonding head frame (12) and variably adjusting said pressure.

2. The bonding head of claim 1, wherein said support means (7, 8, 9) comprise spring means (9a, 9b) which support a transducer holder (7) having the transducer (3) fixed thereto and a linear actuator (8) arranged to variably tension said spring means (9a, 9b), wherein said transducer (3) with said guide (2) are urged toward said substrate by the resulting variable force of the spring means (9a, 9b).

3. The bonding head of claim 2, wherein the spring means comprise at least two leaf springs (9a, 9b), the first end (A, B) of each spring being fixed to the bonding head frame (12) and the second end (C, D) being fixed to said transducer holder (7).

4. The bonding head of claim 3, wherein said spring means (9a, 9b) comprise two or four leaf springs arranged substantially parallel to one another to form a parallelogram or a parallelepiped respectively, the parallel relationship being maintained when the leaf springs are deflected from their rest position by said linear actuator (8).

5. The bonding head of claim 3 or 4, wherein each leaf spring (9a, 9b) is provided with a stiffening member so as not to flex in its central section, while being free to flex at sections either side of the central section adjacent to said first (A, B) and second (C, D) ends.

6. The bonding head of any one of the claims 2, 3 to 4, wherein said linear actuator (8) comprises a fixed element (8b) secured to said frame (12) and a cooperating element (8a) secured to said transducer holder (7), the fixed and cooperating elements (8a, 8b) disposed such that linear displacement therebetween causes deflection of said spring means (9a, 9b) in the direction toward or away from said substrate.

7. The bonding head of any one of the claims 2, 3 to 4, further comprising detecting means (6) for measuring the variable force applied to the wire and control means for automatically adjusting the force to a predetermined value.

8. The bonding head of claim 7, wherein the control means include an electric control loop connected to said detecting means (6) and to the drive of said linear actuator (8), the linear actuator (8) being driven to increase or decrease tension in the spring means (9a, 9b), thereby adjusting the urging force applied to the transducer (3) to obtain the desired predetermined value.

9. The bonding head of any one of the claims 2, 3, or 4, further comprising wire supply means (13) adapted to advance the wire (1) to said guide (2) and to clamp the wire (1) with clamping means (11) for bonding, the wire supply means (13) being connected to an excenter drive (14) to supply the wire (1) at different angles with respect to the vertical direction of the guide (2).

* * * * *